United States Patent [19]
Inoue et al.

[11] Patent Number: 5,953,257
[45] Date of Patent: Sep. 14, 1999

[54] SEMICONDUCTOR MEMORY DEVICE ACCESSIBLE AT HIGH SPEED

[75] Inventors: Kazunari Inoue; Hideaki Abe, both of Hyogo, Japan

[73] Assignee: Mitsubishi Denki Kabushiki Kaisha, Tokyo, Japan

[21] Appl. No.: 08/962,729

[22] Filed: Nov. 3, 1997

[30] Foreign Application Priority Data

Feb. 28, 1997 [JP] Japan .................................. 9-045826
Apr. 30, 1997 [JP] Japan .................................. 9-112570

[51] Int. Cl.$^6$ .................................................. G11C 16/04
[52] U.S. Cl. .............................. 365/189.01; 365/189.05; 365/230.03; 365/230.05
[58] Field of Search ........................ 365/189.07, 230.03, 365/230.05, 189.05

[56] References Cited

U.S. PATENT DOCUMENTS

| | | | |
|---|---|---|---|
| 5,621,679 | 4/1997 | Seo et al. ............................ | 365/230.03 |
| 5,631,872 | 5/1997 | Naritake et al. .................... | 365/230.03 |
| 5,636,174 | 6/1997 | Rao .................................... | 365/230.03 |
| 5,712,828 | 1/1998 | Ogihara et al. .................... | 365/230.03 |
| 5,748,552 | 5/1998 | Fung et al. ......................... | 365/230.03 |
| 5,748,554 | 5/1998 | Barth et al. ........................ | 365/230.03 |
| 5,761,694 | 6/1998 | Rao .................................... | 365/230.03 |

FOREIGN PATENT DOCUMENTS

| | | |
|---|---|---|
| 0 552426 | 7/1993 | European Pat. Off. . |
| 2-61893 | 3/1990 | Japan . |
| 5-20870 | 1/1993 | Japan . |
| 5-89664 | 4/1993 | Japan . |
| 5-265856 | 10/1993 | Japan . |

Primary Examiner—David Nelms
Assistant Examiner—Tuan T. Nguyen
Attorney, Agent, or Firm—McDermott, Will & Emery

[57] ABSTRACT

A DRAM includes a data transfer pipeline register group between a dynamic memory cell array and a static memory cell array, a first unidirectional read bus and a first unidirectional write bus connected between a data transfer bus group and the data transfer pipeline register group, and a second unidirectional write bus and a second unidirectional read bus connected between the data transfer pipeline register group and the static memory cell array. The operating frequency of the second unidirectional write bus and the second unidirectional read bus is N times the operating frequency of the first unidirectional read bus and the first unidirectional write bus. The number of lines of the second unidirectional write bus and the second unidirectional read bus is 1/N time the number of lines of the first unidirectional read bus and the first unidirectional write bus. The dynamic memory cell array is further divided into a hierarchical manner of main banks and subbanks.

5 Claims, 10 Drawing Sheets

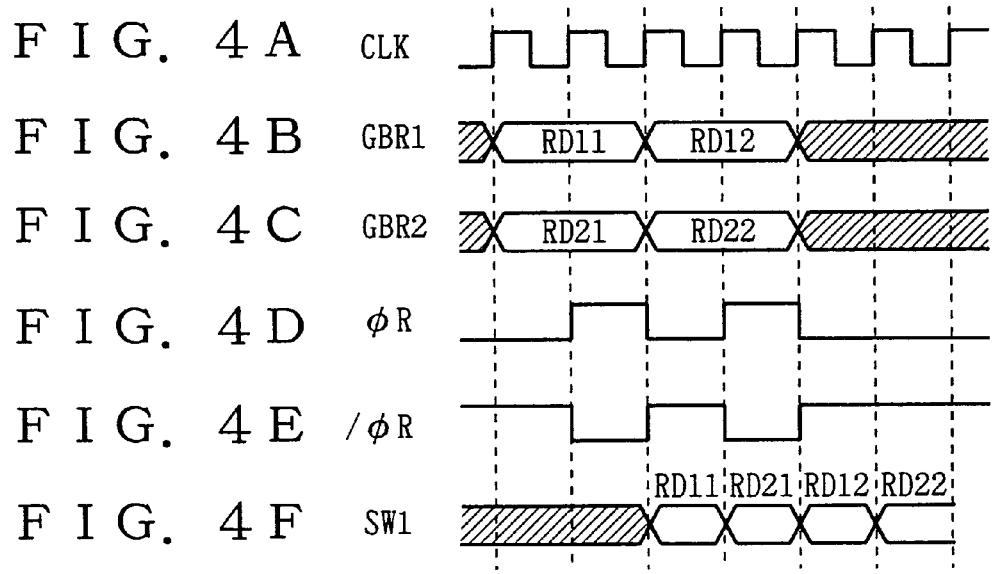
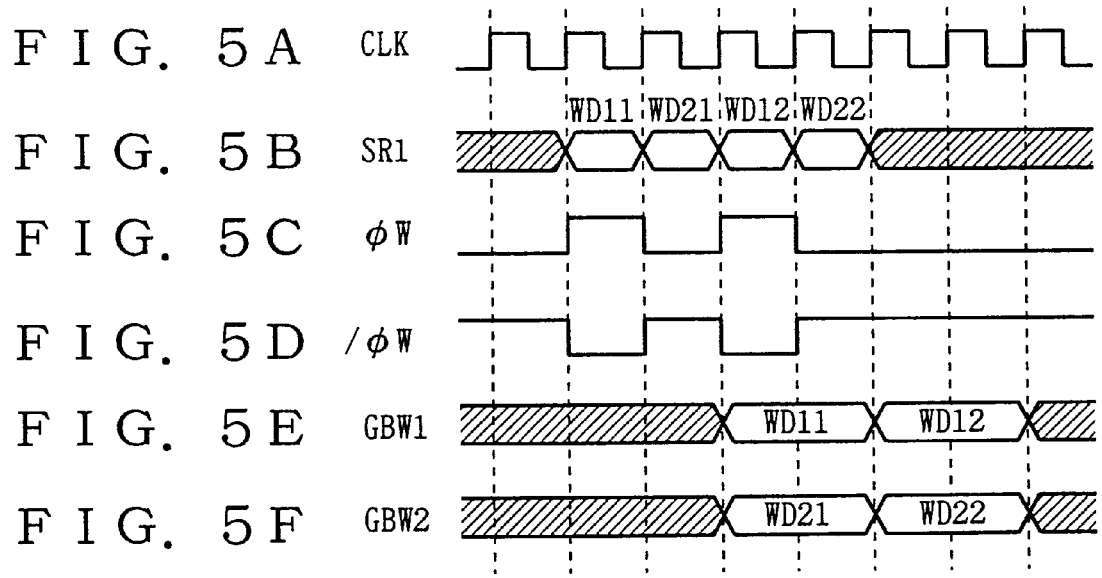

SEMICONDUCTOR MEMORY DEVICE ACCESSIBLE AT HIGH SPEED

BACKGROUND OF THE INVENTION

1. Field of the Invention

The present invention relates to semiconductor memory devices. More particularly, the present invention relates to an embedded DRAM (Dynamic Random Access Memory) having a high bandwidth.

2. Description of the Background Art

In recent years, the significant improvement in the performance of the computer system such as the operating speed based on a CPU has induced the intensive demand for improving the bandwidth even for DRAMs. In general, the bandwidth is defined by the following equation (1).

$$\text{Bandwidth} = \text{number of data bus lines} \times \text{operating frequency of data bus} \quad (1)$$

In order to increase the bandwidth, the number of lines of the data bus (bus width) must be increased. Alternatively, the operating frequency of the data bus must be increased by fabricating a chip according to a process technique that allows fabrication of a transistor of superior characteristics. However, both approaches are costly and implementation thereof is not easy. This is because improvement in performance is always carried out under the trade off between performance and cost.

In some microprocessors, the method of increasing the operating frequency of the data bus is effected by providing a pipeline register as a relay. However, in a DRAM, the data signal of a memory cell and the data signal amplified by a sense amplifier are both so weak that a bidirectional and complementary type input/output data bus is generally employed for the sense amplifier.

Referring to FIG. 12, a conventional typical embedded DRAM includes a dynamic memory cell array (DMCA) 100 divided into four banks #1–#4, row decoders 101(#1)–101(#4) provided corresponding to banks #1–#4, respectively, column decoders 102(#1)–102(#4) provided corresponding to banks #1–#4, respectively, sense amplifier groups SA(#1)–SA(#4) provided corresponding to banks #1–#4, respectively, a static memory cell array (SMCA) 200 functioning as a cache memory, bidirectional read/write buses 1030(#1)–1030(#4) connected between sense amplifier groups SA(#1)–SA(#4) and static memory cell array 200, and a bidirectional read/write bus 2000 connected between static memory cell array 200 and an external pin (not shown).

Bidirectional and complementary type read/write buses 1030(#1)–1030(#4) are employed in the conventional embedded DRAM. Although not shown, there may be another amplifier provided immediately preceding static memory cell array 200 since the data signal output from sense amplifier groups SA(#1)–SA(#4) is weak. Even if the path from the amplifier to the external pin could be pipelined, it was difficult to pipeline the bidirectional and complementary type read/write bus per se.

Thus, in order to increase the bandwidth of a DRAM, the method of increasing the number of lines of read/write buses 1030(#1)–1030(#4) or slightly increasing the operating speed of the entire DRAM was taken. It was difficult to significantly increase the number of read/write buses 1030(#1)–1030(#4) since they are generally arranged on a shunt region of the word line.

Various DRAMs having a high bandwidth have been proposed. However, none exhibit definite improvement in the average or worst case bandwidth despite their higher peak of the bandwidth. For example, in a synchronous DRAM, the bandwidth is 800 Mbytes/seconds for the best case and 114 Mbytes/seconds for the worst case.

In the field of a DRAM for a frame buffer, there is a method of dividing the memory cell array into a plurality of banks in order to reduce the page miss rate. When random access is effected over a plurality of banks in a DRAM having one column decoder provided in common to a plurality of banks, the access speed was limited to 20 nano seconds at most. High speed random access over a plurality of banks is allowed in a DRAM having a column decoder and a bank provided in a one-to-one correspondence. However, the penalty in silicon by the column decoder is great.

Problems in conventional art are summarized as follows.

(1) A greater number of data bus lines for the purpose of increasing the bandwidth causes increase in silicon penalty.

(2) A greater number of banks for the purpose of reducing the page miss rate causes increase in silicon penalty.

(3) Usage of a DRAM as a frame buffer causes increase of page miss in CRT refresh.

SUMMARY OF THE INVENTION

In view of the foregoing, an object of the present invention is to provide a semiconductor memory device having a high bandwidth that does not increase silicon penalty.

According to an aspect of the present invention, a semiconductor memory device includes a dynamic memory cell array, a series of sense amplifiers, a plurality of read/write line pairs, a plurality of read buffers, a plurality of write buffers, a plurality of first read lines, a plurality of first write lines, a read register, a write register, a static memory cell array, a second write line, and a second read line. The dynamic memory cell array includes a plurality of bit line pairs. The series of sense amplifiers is connected to the plurality of bit line pairs. The plurality of read/write line pairs are connected to the plurality of bit line pairs. Each read buffer corresponds to one read/write line pair, and is connected to that corresponding read/write line pair. Each write buffer corresponds to one read/write line pair, and is connected to that corresponding read/write line pair. Each first read line corresponds to one read buffer, and is connected to that corresponding read buffer. Each first write line corresponds to one write buffer, and is connected to that corresponding write buffer. The read register is connected to the plurality of first read lines. The write register is connected to the plurality of first write lines. The second write line is connected between the read register and the static memory cell array so as to write data from the read register to the static memory cell array. The second read line is connected between the static memory cell array and the write register so as to read out data from the static memory cell array to the write register.

Preferably, the operating frequency of the second write and read lines is N times (N is a natural number) the operating frequency of the first read and write lines. The number of the second write and read lines is 1/N times the number of the first read and write lines.

Preferably, the read and write buffers are adjacent to the series of the sense amplifiers. The read and write registers are adjacent to the static memory cell array. The first read and write lines are formed on the dynamic memory cell array.

Preferably, the read and write buffers and the read and write registers are adjacent to the series of sense amplifiers.

The second read and write lines are formed on the dynamic memory cell array.

Since the read and write registers and the static memory cell array are connected by the second write and read lines, the bandwidth can be expanded.

Since the operating frequency of the second write and read lines is N times the operating frequency of the first read and write lines, and the number of the second write and read lines is 1/N times the number of the first read and write lines, the data transfer rate, and in turn the bandwidth, can be improved without increasing the number of the second write and read lines.

Since read and write registers are adjacent to the static memory cell array, increase in the silicon penalty caused by the signal lines for controlling the read and write registers is suppressed.

Furthermore, since read and write registers in addition to the read and write buffers are adjacent to the series of sense amplifiers, the number of second write and read lines formed on the dynamic memory cell array can be reduced.

According to another aspect of the present invention, a semiconductor memory device includes a static memory cell array. The dynamic memory cell array is divided into a plurality of main banks. Each main bank is divided into a plurality of subbanks. The semiconductor memory device further includes a plurality of first decoders, and a plurality of second decoders. Each first decoder corresponds to one main bank, and is connected to that corresponding main bank. Each second decoder corresponds to one subbank, and is connected to that corresponding subbank.

By providing the banks of the dynamic memory cell array in a hierarchical manner, the number of subbanks (the virtual banks) can be increased without increasing the number of the main banks (apparent banks). Thus, increase in the silicon penalty can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4F are timing charts showing an operation of the read pipeline register of FIG. 3.

FIGS. 5A–5F are timing charts representing an operation of the write pipeline register of FIG. 3.

DESCRIPTION OF THE PREFERRED EMBODIMENTS

Figure 1:
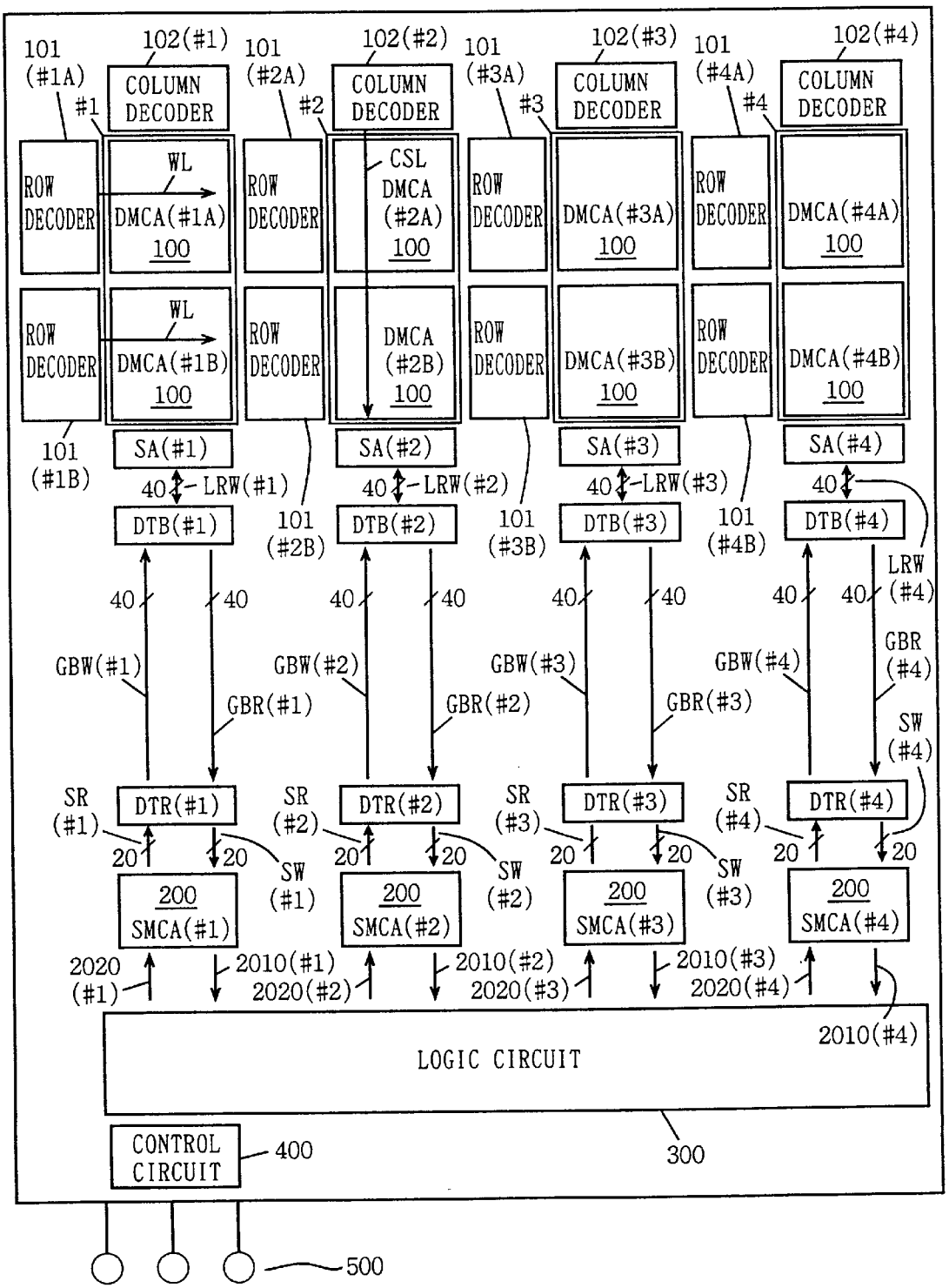
FIG. 1 is a block diagram showing a structure of an embedded DRAM according to a first embodiment of the present invention.

Embodiments of the present invention will be described hereinafter with reference to the drawings. In the drawings, likewise reference characters denote the same or corresponding elements.

First Embodiment

Referring to FIG. 1, an embedded DRAM according to a first embodiment of the present invention includes a dynamic memory cell array (DMCA) divided into four main banks #1–#4, four sense amplifier groups SA(#1)–SA(#4) provided corresponding to four main banks #1–#4, respectively, four data transfer buffer groups DTB(#1)–DTB(#4) provided corresponding to four sense amplifier groups SA(#1)–SA(#4), respectively, bidirectional read/write buses LRW(#1)–LRW(#4) connected between sense amplifier groups SA(#1)–SA(#4) and data transfer buffer groups DTB(#1)–DTB(#4), data transfer pipeline register groups DTR(#1)–DTR(#4) provided corresponding to data transfer buffer groups DTB(#1)–DTB(#4), respectively, unidirectional read buses GBR(#1)–GBR(#4) connected between data transfer buffers DTB(#1)–DTB(#4) and data transfer pipeline register groups DTR(#1)–DTR(#4) for transferring data from data transfer buffer groups DTB(#1)–DTB(#4) to data transfer pipeline register groups DTR(#1)–DTR(#4), unidirectional write buses GBW(#1)–GBW(#4) connected between data transfer pipeline register groups DTR(#1)–DTR(#4) and data transfer buffer groups DTB(#1)–DTB(#4) for transferring data from data transfer pipeline register groups DTR(#2)–DTR(#4) to data transfer buffer groups DTB(#1)–DTB(#4), a static memory cell array (SMCA) 200 divided into four banks #1–#4, unidirectional write buses SW(#1)–SW(#4) connected between data transfer pipeline register groups DTR(#1)–DTR(#4) and banks #1–#4 of static memory cell array 200 for transferring data from data transfer pipeline register groups DTR(#1)–DTR(#4) to banks #1–#4 of static memory cell array 200, and a unidirectional read bus SR(#1)–SR(#4) connected between banks #1–#4 of static memory cell array 200 and data transfer pipeline register groups DTR(#1)–DTR(#4) for transferring data from banks #1–#4 of static memory cell array 200 to data transfer pipeline register groups DTR(#1)–DTR(#4).

Each of main banks (#1–#4 is divided into two subbanks #A and #B. The DRAM further includes column decoders 102(#1)–102(#4) provided corresponding to main banks #1–#4, respectively, and eight row decoders 101(#1A), 101(#1B)–101(#4A), 101(#4B) provided corresponding to eight subbanks #1A, #1B–#4A, #4B, respectively.

The DRAM further includes a logic circuit 300 for the input/output of a data signal, unidirectional read buses 2010(#1)–2010(#4) and unidirectional write buses 2020(#1)–2020(#4) connected between banks #1–#4 of static memory cell array 200 and logic circuit 300, a control circuit 400 for controlling the above circuits, and an external pin 500.

Bidirectional read/write buses LRW(#1)–LRW(#4) are complementary type buses for transferring a data signal from sense amplifier groups SA(#1)–SA(#4) to data transfer buffers groups DTB(#1)–DTB(#4) at the time of read out, and for transferring a data signal from data transfer buffer groups DTB(#1)–DTB(#4) to sense amplifier groups SA(#1) –SA(#4) at the time of writing.

Unidirectional read buses GBR(#1)–GBR(#4) transfer a data signal from data transfer buffer groups DTB(#1)–DTB(#4) to data transfer pipeline register groups DTR(#1)–DTR(#4) at the time of read out. Unidirectional write buses GBW(#1)–GBW(#4) transfer a data signal from data transfer pipeline register groups DTR(#1)–DTR(#4) to data transfer buffer groups DTB(#1)–DTB(#4) at the time of writing.

When row decoder 101(#1A), for example, selects a word line WL, a data signal is read out from all the memory cells (not shown) connected to the selected word line WL to a bit line pair (not shown). The data signals are amplified by sense amplifier group SA(#1). When column decoder 102(#1) selects a column select line (not shown), a data signal is transferred from the bit line pair corresponding to the selected column select line to data transfer buffer group DTB(#1) via bidirectional read/write bus LRW(#1).

Although data signals are amplified by sense amplifier groups SA(#1)–SA(#4) as described above, the signals are very weak. Therefore, data transfer buffer groups DTB(#1) –DTB(#4) are arranged in the proximity of sense amplifier groups SA(#1)–SA(#4) to reduce the length of bidirectional read/write buses LRW(#1)–LRW(#4) as much as possible. Since the bus driving capability of data transfer buffer groups DTB(#1)–DTB(#4) is greater than that of sense amplifier groups SA(#1)–SA(#4), the length of unidirectional read buses GBR(#1)–GBR(#4) and unidirectional write buses GBW(#1)–GBW(#4) can be made longer than the length of bidirecitonal read/write buses LRW(#1)–LRW(#4).

Static memory cell array 200 includes four ports connected to unidirectional read buses SR(#1)–SR(#4), unidirectional write buses SW(#1)–SW(#4), unidirectional read buses 2010(#1)–2010(#4) and unidirectional write buses 2020(#1)–2020(#4).

Figure 2:
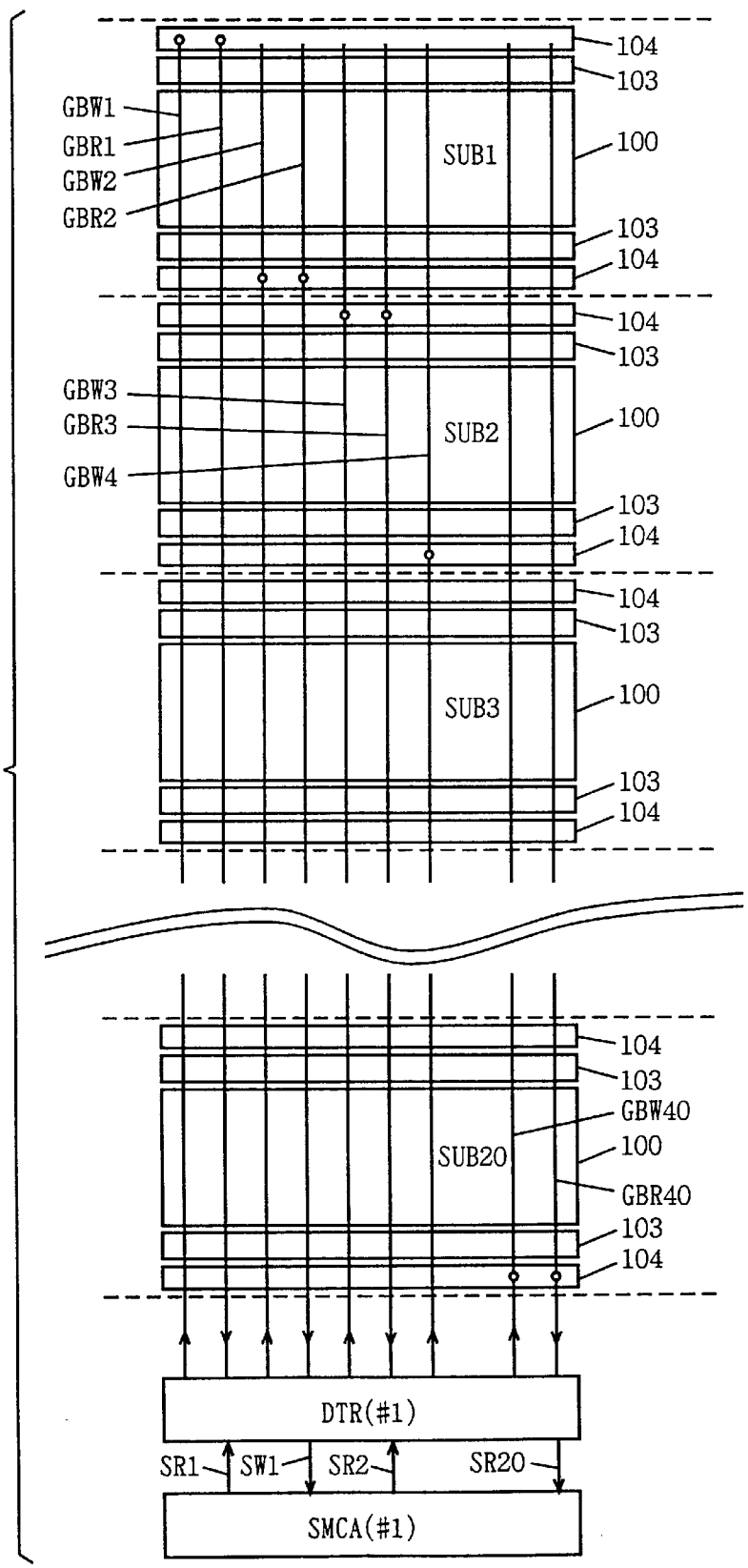
FIG. 2 is a layout diagram showing a structure of one main bank of FIG. 1.

Each of main banks #1–#4 is divided into 20 subarrays. For example, main bank #1 is divided into 20 subarrays SUB1–SUB20 as shown in FIG. 2. Sense amplifier group SA(#1) is divided into 20 series of sense amplifiers 103. Data transfer buffer group DTB(#1) is divided into 40 series of data transfer buffers 104. Two series of sense amplifiers 103 are arranged adjacent to both sides of each of subarrays SUB1–SUB20. Furthermore, two series of data transfer buffers 104 are arranged adjacent to both sides thereof. The other main banks #2–#4 have a structure similar to that of main bank #1.

Figure 3:
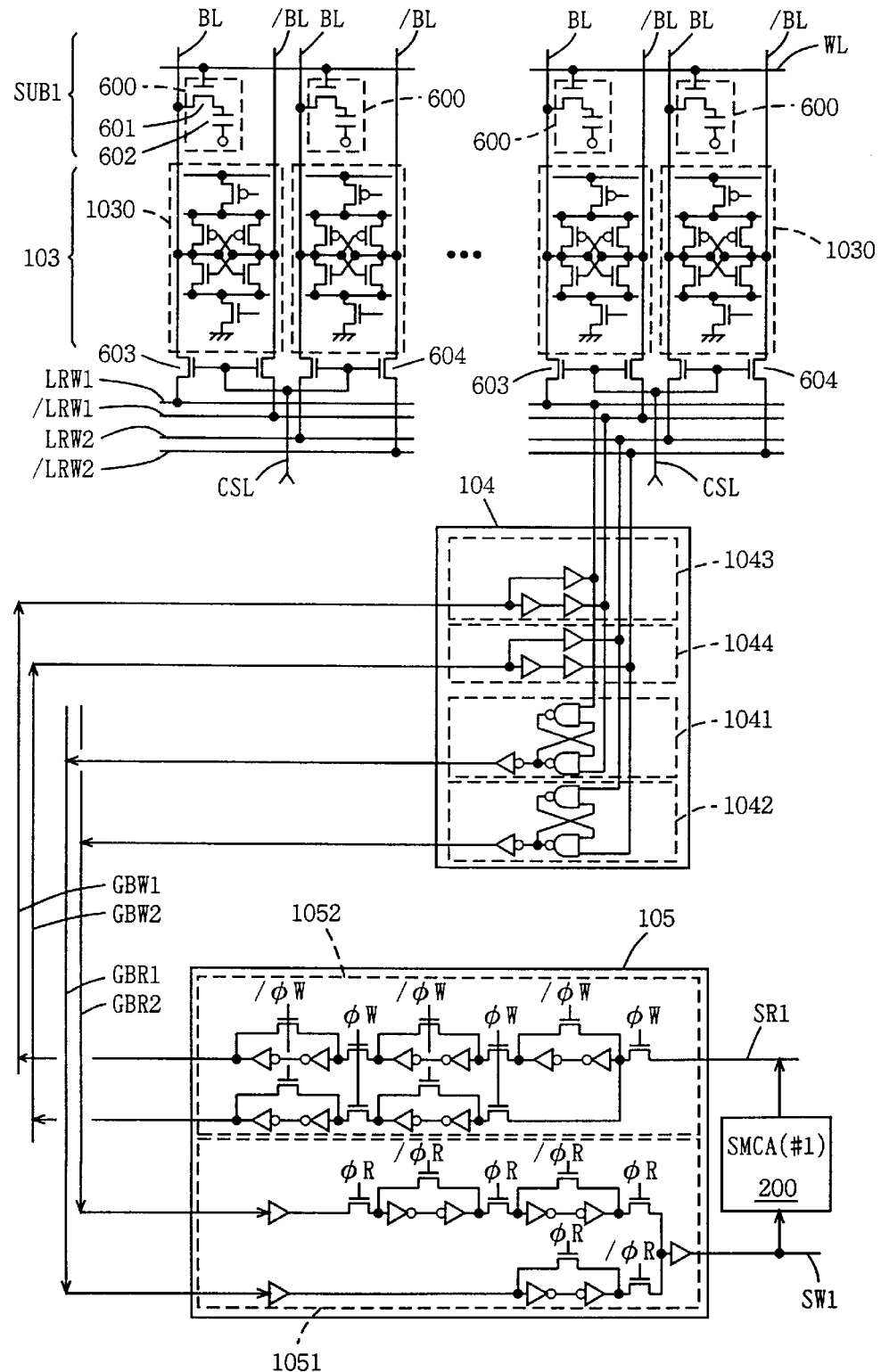
FIG. 3 is a circuit diagram showing an arrangement of one subarray of FIG. 2, a corresponding data transfer buffer, and a data transfer pipeline register.

Subarray SUB1 includes a plurality of word lines WL arranged as shown in FIG. 3, a plurality of bit line pairs BL, /BL arranged in columns, and a plurality of dynamic memory cells 600 arranged in a matrix. Each memory cell 600 includes an access transistor 601 and a capacitor 602.

The series of sense amplifiers 103 include a plurality of sense amplifiers 1030. Sense amplifier 1030 is connected to the pair of bit lines BL, /BL.

Two local read/write line pairs LRW1, /LRW1 and LRW2, /LRW2 are arranged corresponding to one subarray SUB1. Half of the bit line pairs BL, /BL in subarray SUB1 are connected in common to one local read/write line pair LRW1, /LRW1 via column select gates 603 and 604. The remaining half are connected in common to the other local read/write line pair LRW2, /LRW2 via column select gates 603 and 604.

One column select line CSL is arranged corresponding to two bit line pairs BL, /BL. One column select line CSL is connected to the gates of four column select gates 603, 604 connected to the two bit line pairs BL, /BL. Column select gate CSL is connected to column decoder 102 (#1) shown in FIG. 1.

Local read/write line pair LRW1, /LRW1 are arranged at one side (the upper side in the drawing) in subarray SUB1 shown in FIG. 2, and local read/write line pair LRW2,/LRW2 are arranged at the other side (the lower side in the drawing) in subarray SUB. Therefore, sense amplifiers 1030 connected to local read/write line pair LRW1, /LRW1 form a series of sense amplifiers 103 arranged at one side (upper side in the drawing) of subarray SUB1 shown in FIG. 2. Sense amplifiers 1030 connected to local read/write line pair LRW2, /LRW2 form a series of sense amplifiers 103 arranged at the other side (lower side in the drawing) of subarray SUB1.

The series of data transfer buffers 104 include two read buffers 1041 and 1042 as shown in FIG. 3, and two write buffers 1043 and 1044. Read buffers 1041 and 1042 are provided corresponding to local read/write line pairs LRW1, /LRW1, and LRW2, /LRW2, respectively. Read buffer 1041 is connected to a corresponding local read/write line pair LRW1, /LRW1. Read buffer 1042 is connected to a corresponding local read/write line pair LRW2, /LRW2.

Write buffers 1043 and 1044 are provided corresponding to local read/write line pairs LRW1, /LRW1 and LRW2, /LRW2. Write buffer 1043 is connected to a corresponding local read/write line pair LRW1, /LRW1. Write buffer 1044 is connected to a corresponding local read/write line pair LRW2, /LRW2.

Read buffer 1041 and write buffer 1043 form data transfer buffer 104 arranged at one side (upper side in the drawing) in subarray SUB1 of FIG. 2. Read buffer 1042 and write buffer 1044 form data transfer buffer 104 arranged at the other side (lower side in the drawing) of subarray SUB1.

Data transfer pipeline register group (#1) includes 20 data transfer pipeline registers 105 as shown in FIG. 3 corresponding to 20 subarrays SUB1–SUB20. Therefore, one data transfer pipeline register 105 is provided corresponding to one data transfer buffer 104 of FIG. 3.

Data transfer pipeline register 105 includes a read pipeline register 1051 and a write pipeline register 1052 as shown in FIG. 3. Read buffers 1041 and 1042 are connected to read pipeline register 1051 via global read lines GBR1 and GBR2, respectively. Write pipeline register 1052 is connected to write buffers 1043 and 1044 via global write lines GBW1 and GBW2. Read pipeline register 1051 is connected to bank #1 of static memory cell array 200 via SRAM write line SW1. Bank #1 of static memory cell array 200 is connected to write pipeline register 1052 via SRAM read line SR1.

The other subarrays SUB2–SUB20 have a structure similar to that of subarray SUB1. Since the two pairs of local read/write lines LRW1, /LRW1 and LRW2, /LRW2 of FIG. 3 are provided corresponding to subarrays SUB1–SUB20 of FIG. 2, bidirectional read/write bus LRW(#1) of FIG. 1 includes 40 pairs of local read/write lines. Since two global read lines GBR1 and GBR2 as shown in FIG. 3 are provided corresponding to each SUB1–SUB20 of FIG. 2, unidirectional read bus GBR(#1) of FIG. 1 includes 40 global read lines. Furthermore, since two global write lines GBW1 and GBW2 are provided corresponding to each of subarrays SUB1–SUB20, unidirectional write bus GBR(#1) of FIG. 1 includes 40 global write lines. One data transfer pipeline register 105 of FIG. 3 is provided corresponding to each of subarrays SUB1–SUB20. Therefore, unidirectional write bus SW(#1) of FIG. 1 includes 20 SRAM write lines, and unidirectional read bus SR(#1) includes 20 SRAM read lines.

Therefore, the total number (80) of the local read/write lines forming the bidirectional read/write bus (#1) is equal to the total number (80) of the global read lines forming unidirectional read bus GBR(#1) and global write lines forming unidirectional write bus GBR(#1). Also, the total number (40) of the SRAM write lines forming unidirectional write bus SW(#1) and the SRAM read lines forming unidirectional read bus SR(#1) is half the total number (80) of the global read out lines forming unidirectional read bus GBR (#1) and the global write lines forming unidirectional write bus GBW(#1).

The structure of data transfer pipeline register 105 will be described in detail with reference to FIG. 3. Read pipeline register 1051 includes a first path receiving a data signal from global read line GBR1, and a second path receiving a data signal from global read line GBR2. The first path of read pipeline register 1051 includes one latch circuit for latching a data signal in response to read control signals φR and /φR. The second path of read pipeline register 1051 includes two latch circuits for latching a data signal in response to read control signals φR and /φR.

Write pipeline register 1052 includes a first path for providing a data signal to global write line GBWl and a second path for providing a data signal to global write line GBW2. The first path of write pipeline register 1052 includes three latch circuits for latching a data signal in response to write control signals φW and /φW. The second path of write pipeline register 1052 includes two latch circuits for latching a data signal in response to write control signals φW and /φW.

The operation of read pipeline register 1051 will be described hereinafter with reference to the timing charts of FIGS. 4A–4F.

When one of the column select lines CSL shown in FIG. 3 is activated, two corresponding column select gates 603 and 604 are turned on. Two complementary data signals are transferred from two corresponding bit line pairs BL, /BL to local read/write line pairs LRW1, /LRW1 and LRW2, /LRW2, respectively. The complementary data signal of local read/write line pair LRW1, /LRW1 is amplified by read buffer 1041 to be supplied as one data signal RD11 to the first path of read pipeline register 1051 via one global read line GBR1. Simultaneously, the complementary data signal of local read/write pair LRW2, /LRW2 is amplified by read buffer 1042 to be provided as one data signal RD21 to the second path of read pipeline register 1051 via one global read line GBR2.

Data signal RD11 responds to read control signals φR and /φR to be latched in the latch circuit of the first path. Simultaneously, data signal RD21 is latched in the first latch circuit in the second path. Then, the data signal latched in the latch circuit of the first path responds to read control signals φR and /φR to be provided to SRAM write line SW1, whereas data signal RD21 latched in the first latch circuit of the second path is latched in the second latch circuit. Next, data signal RD21 latched in the second latch circuit of the second path responds to read control signals φR and /φR to be supplied to SRAM write line SW1.

Data signals RD12 and RD22 supplied at the same time subsequent to data signals RD11 and RD21 are also sequentially provided to SRAM write line SW1.

The operation of write pipeline register 1052 will be described with reference to the timing charts of FIGS. 5A–5F.

Data signals WD11, WD21, WD12, and WD22 read out from bank #1 of static memory cell array 200 are supplied to write pipeline register 1052 via SRAM read line SR1. Data signal WD11 responds to write control signal φW and /φW to be latched in the first latch circuit of the first path of write pipeline register 1052. Data signal WD21 responds to write control signals φW and /φW to be latched in the first latch circuit of the first path. Then, in response to write control signals φW and /φW, data signal WD11 is latched in the second latch circuit of the first path, whereas data signal WD21 is latched in the first latch circuit of the second path. Next, in response to write control signals φW and /φW, data signal WD11 is latched in the third latch circuit in the first path, whereas data signal WD21 is latched in the second latch circuit of the second path. Then, in response to write control signals φW and /φW, data signal WD11 is provided to write buffer 1043 via one global write line GBW1, whereas data signal WD21 is simultaneously provided to write buffer 1044 via one global write line GBW2. Data signals WD11 and WD21 are amplified by write buffers 1043 and 1044, respectively. When one of column select lines CSL is activated, two corresponding column select gates 603 and 604 are turned on. In response, data signal WD11 of write buffer 1043 is transferred to bit line pair BL, /BL via local read/write line pair LRW1, /LRW1. At the same time, data signal WD21 of write buffer 1044 is transferred to bit line pair BL, /BL via local read/write line pair LRW2, /LRW2.

Similarly to the above manner, data signals WD12 and WD22 are provided concurrently to write buffers 1043 and 1044 via global write lines GBW1 and GBW2, and further provided concurrently to bit line pairs BL, /BL and BL, /BL via local read/write line pairs LRW1, /LRW1 and LRW2, /LRW2.

The structure and operation of the other data transfer pipeline registers included in data transfer pipeline register group DTR(#1) are similar to those of the above-described data transfer pipeline register 105.

Focusing on one subarray SUB1, the number (1) of SRAM write line SW1 is ½ the number (2) of global read lines GBR1 and GBR2. The operating frequency of SRAM write line SW1 is two times the operating frequency of global read lines GBR1 and GBR2. Therefore, the number (1) of SRAM read line SR1 is ½ the number (2) of global write lines GBW1 and GBW2, whereas the operating frequency of SRAM read out line SR1 is two times the operating frequency of global write lines GBW1 and GBW2.

Focusing on one main bank #1 shown in FIG. 1, the width (20 bits) of unidirectional write bus SW(#1) is ½ times the width (40 bits) of unidirectional read bus GBW(#1), whereas the operating frequency of unidirectional write bus SW(#1) is two times the operating frequency of unidirectional read bus GBR(#1). Also, the width (20 bits) of unidirectional read bus SR(#1) is ½ times the width (40 bits) of unidirectional write bus (#1), whereas the operating frequency of unidirectional read bus SR(#1) is two times the operating frequency of unidirectional write bus GBW(#1).

Since the data signal amplified by sense amplifier 1030 is weak, local read/write lines LRW1, /LRW1 and LRW2, /LRW2 are complementary lines and commonly shared for read out and writing. In contrast, the data signal amplified by read buffers 1041 and 1042 is intensive, so that global read lines GBR1 and /GBR2 are of the single-line type and exclusively used for read out. Accordingly, global write lines GBW1 and /GBW2 are of the single line type and exclusively used for writing. In the first embodiment, the number of buses connected between the data transfer buffer and the data transfer pipeline register is equal to the numbers of bidirectional read/write buses although they are dedicated for only reading or writing.

In a conventional typical embedded DRAM, the transfer bus between the dynamic memory cell array and the static memory cell array is of a complementary type commonly used for reading and writing. In contrast, the transfer bus between the dynamic memory cell array and the static memory cell array in the embedded DRAM of the first embodiment of the present invention is of a single line type and used exclusively for reading or writing. Therefore, even though the number of unidirectional read buses GBR(#1)–GBR(#4) and unidirectional write buses GBW(#1)–GBW(#4) is identical to the conventional number of bidirectional read/write buses, the transfer rate of the data signal is doubled, and a read data signal and a write signal can be transferred simultaneously. Therefore, the operating speed is 4 times that of the conventional case.

According to a simulation of a 0.3 μm process used in a 64 M-bits DRAM, the data transfer frequency from dynamic memory cell array 100 to data transfer pipeline registers DRT(#1)–DRT(#4) is 100 MHz. The data transfer frequency between data transfer pipeline register groups DTR(#1)–DTR(#4) and static memory cell array 200 is 200 MHz.

The width in the horizontal direction in the drawing of subarrays SUB1–SUB20 forming one main bank (#1) shown in FIG. 2 in the 64 M-bits DRAM is approximately 4000 μm. It is possible to arrange 6000 power mesh lines and 600 data bus lines thereon.

When, for example, 600 lines of unidirectional read buses GBR(#1)–GBR(#4) and unidirectional write buses GBW(#1)–GBW(#4) are provided with an operating frequency of 100 MHz, and 300 lines of unidirectional write buses SW(#1)–SW(#4) and unidirectional read buses SR(#1)–SR(#4) are provided with an operating frequency of 200 MHz, the bandwidth between data transfer pipeline register groups DTR(#1)–DTR(#4) and data transfer buffer groups DTB(#1)–DTB(#4) can be made equal to the bandwidth between data transfer pipeline register groups DTR(#1)–DTR(#4) and static memory cell array 200. In this case, the bandwidth per 1 main bank is 15 G bytes/seconds (=300 bits×2) (read/write)×200 MHz÷8(bits/bytes)).

Although it is necessary to supply many read control signals φR, /φR and write control signals φW, /φW to data transfer pipeline register groups DTR (#1)–DTR(#4), increase in the number of lines for the control signals of φR, /φR and φW, /φW can be suppressed since data transfer pipeline register groups DTR(#1)–DTR(#4) are arranged adjacent to static memory cell array 200, not to the series of sense amplifiers 103 in the first embodiment.

The hierarchical bank structure of dynamic memory cell array 100 of FIG. 1 will be described hereinafter.

Figure 6:
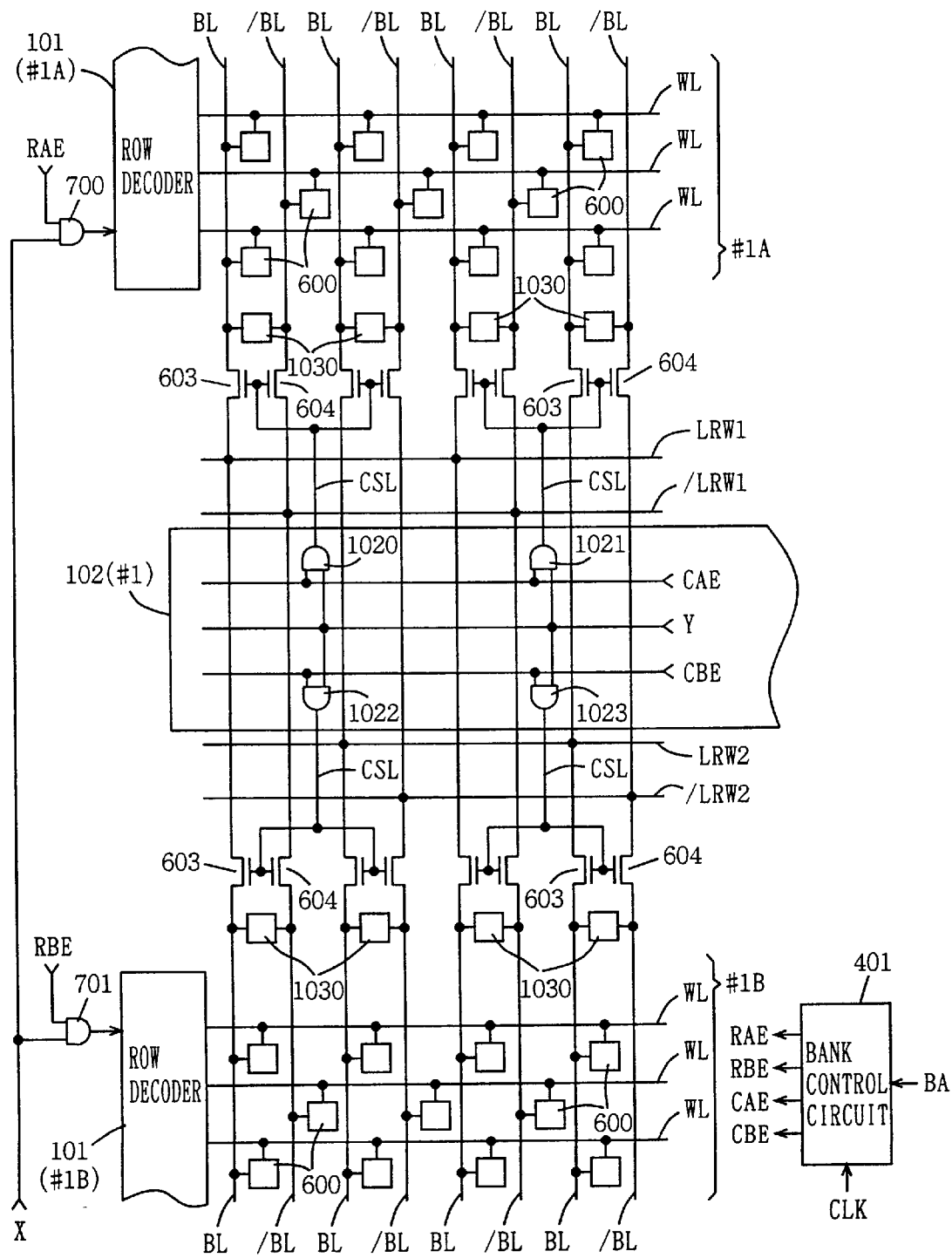
FIG. 6 is a circuit diagram showing an arrangement of one main bank divided into two subbanks shown in FIG. 1.
Figure 7:
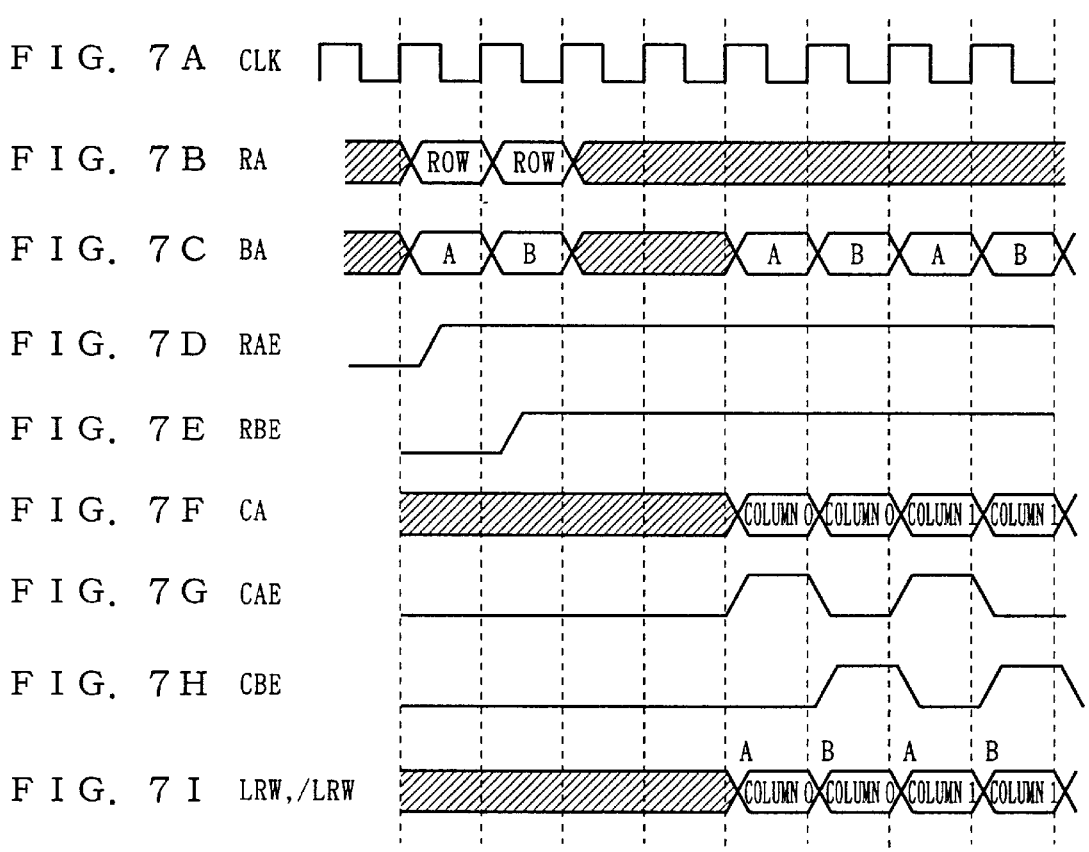
FIGS. 7A–7I are timing charts representing an operation of a hierarchical bank structure of FIG. 6.

Control circuit 400 of FIG. 1 includes a bank control circuit 401 for generating bank enable signals RAE, RBE, CAE, and CBE in response to a bank address signal BA as shown in FIG. 6. The DRAM further includes an AND gate 700 for receiving a row A bank enable signal RAE for activating row decoder 101(#1A), and an AND gate 701 for receiving a row B bank enable signal RBE for activating row decoder 101(#1B). AND gates 700 and 701 further receive a row decode signal X from a row predecoder (not shown) that is well known.

Column decoder 102(#1) includes AND gates 1020 and 1021 for receiving a column A bank enable signal CAE for activating a column select line CSL at the side of subbank #1A, and AND gates 1021 and 1023 for receiving a column B bank enable signal CBE for activating a column select line CSL at the side of subbank #1B. AND gates 1020–1023 further receives a column decode signal Y from a well known column predecoder (not shown).

The operation of the above-described hierarchical bank arrangement will be described hereinafter with reference to the timing charts of FIGS. 7A–7I.

In response to a bank address BA indicating subbank #1A, row A bank enable signal RAE is activated. In response to the currently applied row address signal RA, row decoder 101(#1A) activates one word line WL in subbank #1A.

Then, when row B bank enable signal RBE is activated in response to bank address signal BA indicating subbank #1B, row decoder 101(#1B) responds to the currently applied row address signal RA to activate one word line WL in subbank #1B.

When column A bank enable signal CAE is activated in response to bank address signal BA indicating subbank #1A, AND gates 1020 and 1021 in column decoder 102(#1) respond to the currently applied column address signal CA to activate one column select line CSL in subbank #1A. Thus, data signals are transferred from the two selected bit line pairs BL, /BL in subbank #1A to local read/write line pairs LRW1, /LRW1 and LRW2, /LRW2.

When column B bank enable signal CBE is activated in response to bank address signal BA indicating subbank #1B, AND gates 1022 and 1023 in column decoder 102(#1) respond to the currently applied column address signal CA to active one column select line CSL in subbank #1B. Thus, data signals are transferred from the two selected bit line pairs BL, /BL in subbank #1B to local read/write line pairs LRW1, /LRW1 and LRW2, /LRW2.

Then, bank address signal BA indicating subbank #1A and bank address signal BA indicating subbank #1B are sequentially applied in a manner similar to that described above. When column address signal CA is sequentially applied in synchronization with bank address signal BA, a data signal is transferred to local read/write line pairs LRW1, /LRW1 and LRW2, /LRW2 in the sequence of subbanks #1A and #1B in a manner as described above.

Focusing on, for example, one main bank #1, it seems that memory cell 600 in main bank #1 is simply selected by row decoders 101(#1A), and 101(#1B) and column decoder 102(#1). In practice, memory cell 600 in subbank #1A is selected by row decoder 101(#1A) and column decoder 102(#1), and memory cell 600 in subbank #1B is selected by row decoder 101(#1B) and column decoder 102(#1).

Figure 12:
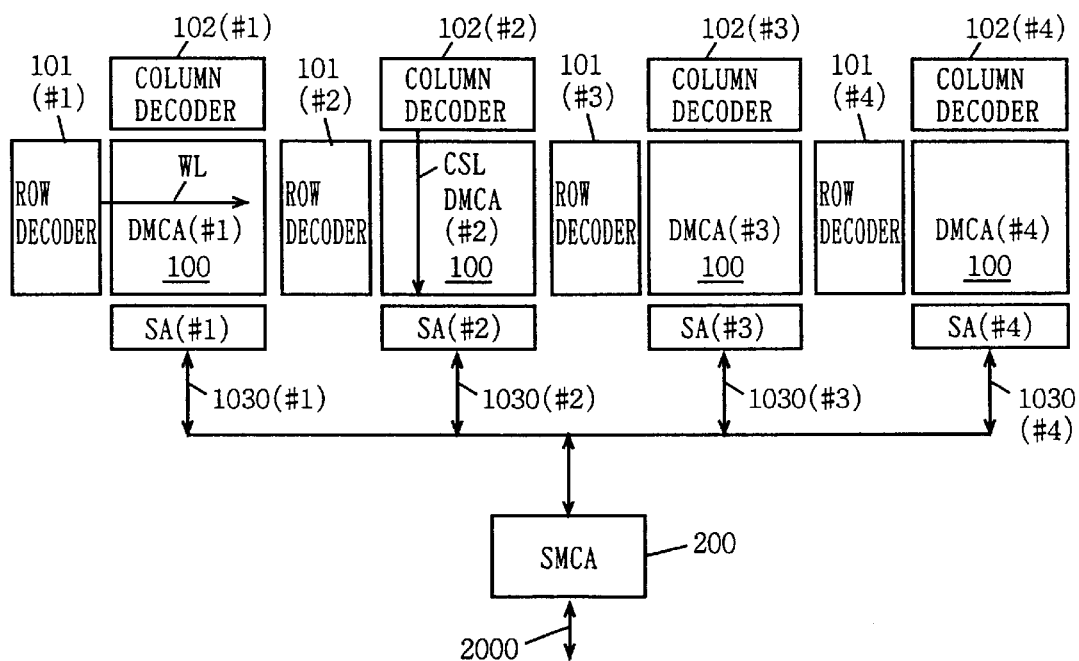
FIG. 12 is a block diagram showing a structure of a conventional embedded DRAM.

Since the banks are provided in a hierarchical manner in the first embodiment, the number of apparent banks (main banks #1–#4) is equal to that of the conventional case shown in FIG. 12, whereas the number of the virtual banks (subbanks #1A–#4A, #1B–#4B) are two times that of the conventional case. As a result, increase in the silicon penalty is suppressed since the number of apparent banks is not increased.

Second Embodiment

Figure 8:
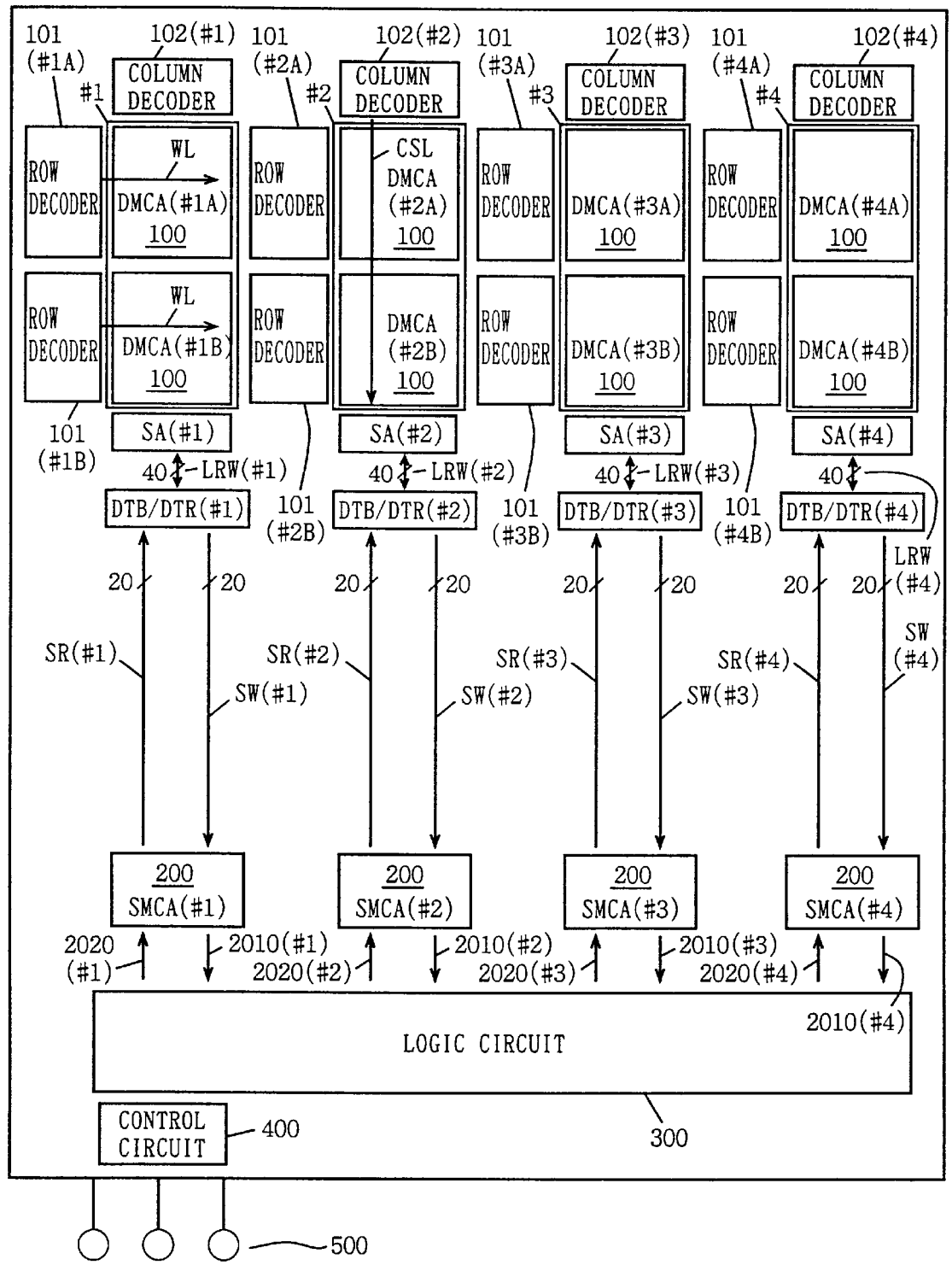
FIG. 8 is a block diagram showing a structure of an embedded DRAM according to a second embodiment of the present invention.

In the previous first embodiment shown in FIG. 1, data transfer buffer groups DTB(#1)–DTB(#4) and data transfer pipeline register groups DTR(#1)–DTR(#4) are arranged separately. In a second embodiment of the present invention shown in FIG. 8, data transfer buffer/pipeline register groups DTB/DTR(#1)–DTB/DTR(#4) which is an integral unit thereof is provided. Therefore, not only the data transfer buffer, but also the data transfer pipeline register is adjacent to the series of sense amplifiers. More specifically, only data transfer buffer 104 is adjacent to the series of sense amplifiers 103 in the first embodiment of FIG. 2, whereas data transfer buffer/pipeline register 800 is adjacent to the series of sense amplifiers 103 in the second embodiment shown in FIG. 9.

Figure 10:
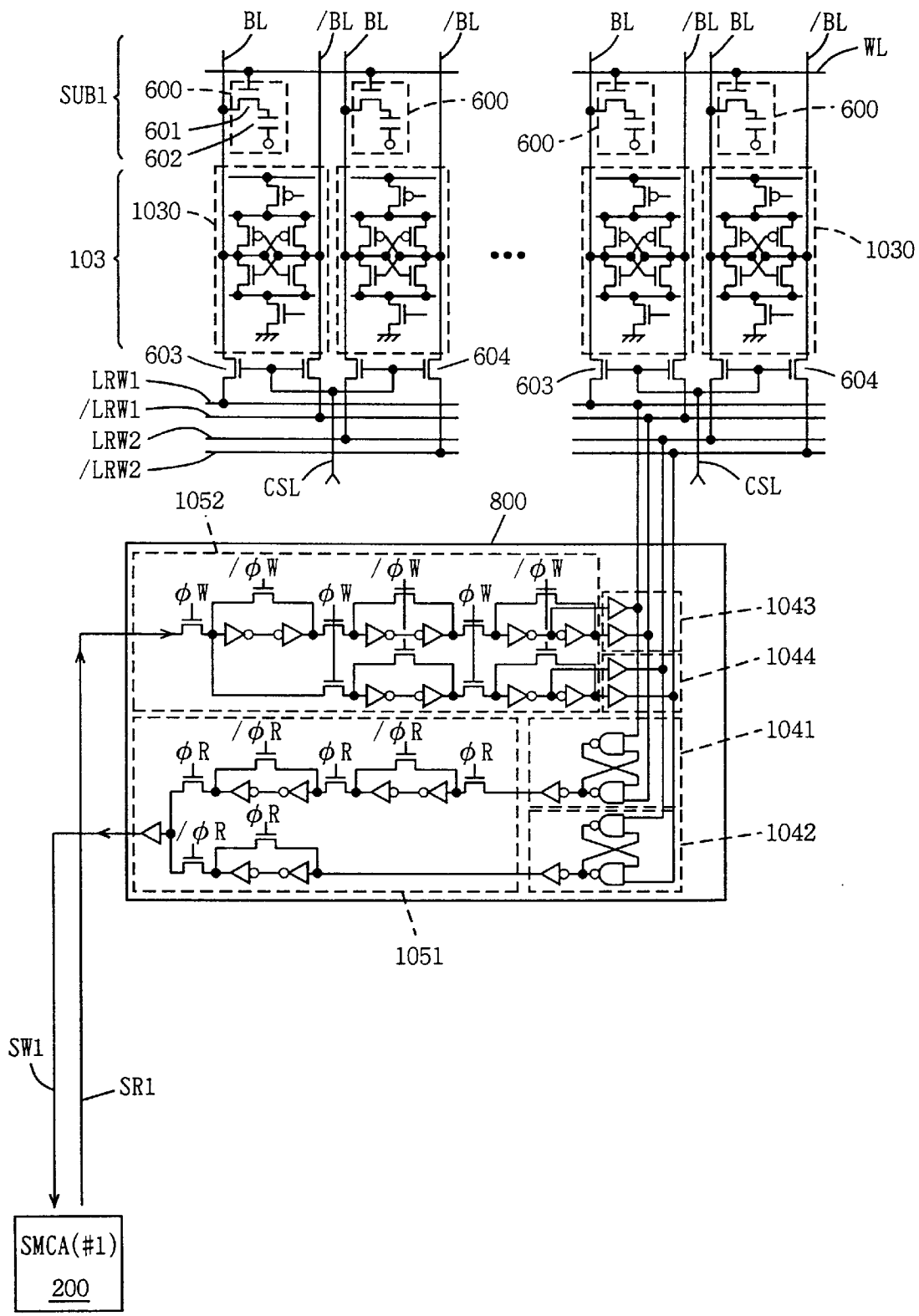
FIG. 10 is a circuit diagram showing an arrangement of one subarray of FIG. 9, and a corresponding data transfer buffer/pipeline register.

Referring to FIG. 10, data transfer buffer/pipeline register 800 includes read buffers 1041 and 1042, write buffers 1043 and 1044, a read pipeline register 1051, and a write pipeline register 1052. The operation of this data transfer buffer/pipeline register 800 is similar to the above-described operations of data transfer buffer 104 and data transfer pipeline register 105 since it is only an integral form of data transfer buffer 104 and data transfer pipeline register 105 shown in FIG. 3.

Figure 9:
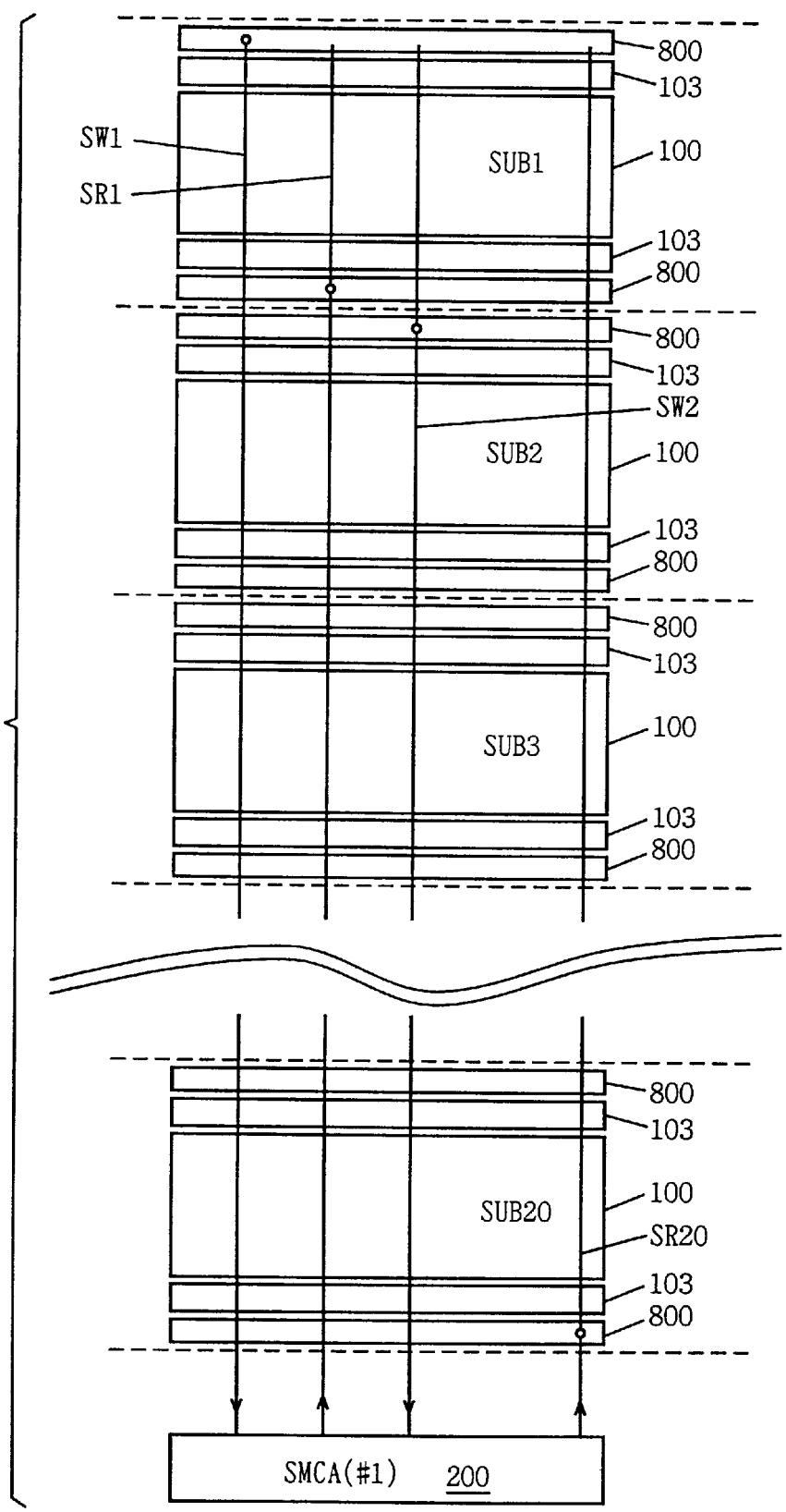
FIG. 9 is a layout diagram showing a structure of one main bank of FIG. 8.

In the second embodiment, SRAM write lines SW1 and SW2 and SRAM read lines SR1–SR20 are formed on dynamic memory cell array 100 as shown in FIG. 9.

Therefore, the number of lines (40) of unidirectional write bus SW(#1) and unidirectional read bus SR(#1) is ½ the number of lines (80) of bidirecitonal read/write bus LRW (#1), whereas the operating frequency of unidirectional writ bus SW(#1) and unidirectional read bus SR(#1) is two times the operating frequency of bidirectional read/write bus LRW (#1). Thus, although the number of lines (40) of unidirectional write bus SW(#1) and unidirectional read bus SR(#1) is identical to the number of lines (40) of the conventional bidirectional read/write bus, the transfer speed of a data signal is doubled, and simultaneous transfer of a read data signal and a write data signal is possible. Therefore, the operating speed is 4 times that of the conventional case.

A case where a DRAM having hierarchical banks as in the first and second embodiments is used as a frame buffer will be described hereinafter. In this case, at least two different pages, i.e. a page for drawing and a page for CRT refresh, must be accessed.

In the DRAM of the first and second embodiments, eight independent row decoders 101(#1A)–101(#4A), 101(#1B)–101(#4B) are provided corresponding to eight subbanks #1A–#4A, #1B–#4B, respectively. Therefore, eight different rows, i.e. 8 different pages, are accessible. However, row decoder 101(#1A) is common to row decoder 101(#1B). Row decoder 101(#2A) is common to row decoder 101 (#2B). Row decoder 101(#3A) is common to row decoder 101(#3B). Row decoder 101(#4A) is common to row decoder 102(#4B). Therefore, row decoders 101(#1A)–101 (#4A), 101(#1B)–101(#4B) form 4 banks. The local read/write line pair is shared by two subbanks if eight different pages are accessible. Therefore, in subbanks #1A–#4A or #1B–#4B, data can be transferred with no restriction. In contrast, interlock occurs between subbanks #1A and #1B, subbanks #2A and #2B, subbanks #3A and #3B, and subbanks #4A and #4B.

Figure 11:
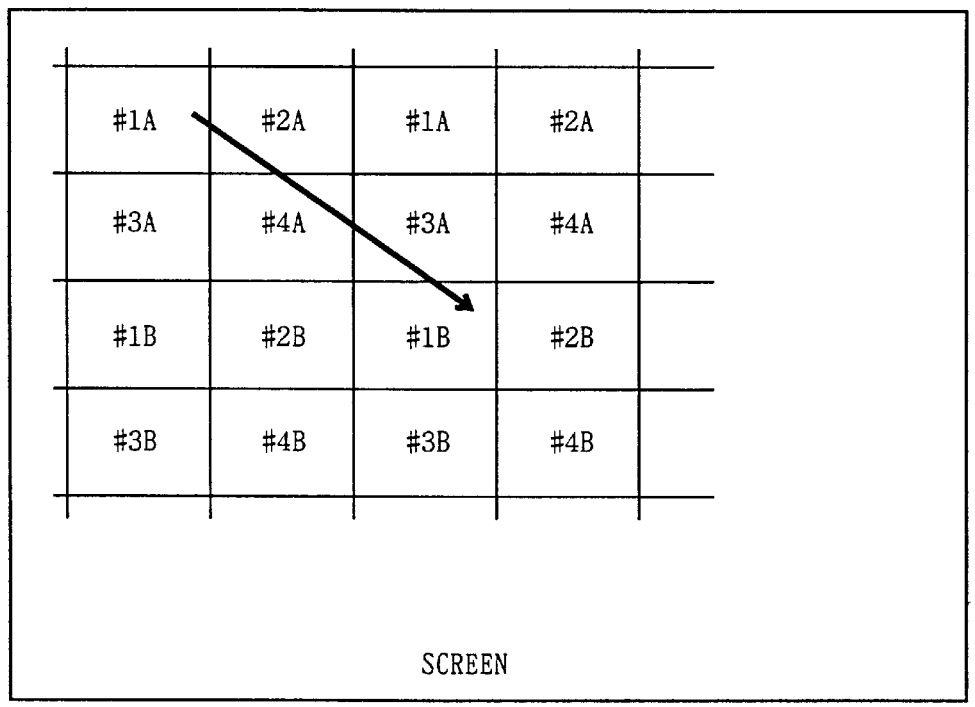
FIG. 11 shows a preferable mapping example when the DRAM having a hierarchical bank structure shown in FIGS. 1 and 2 is used as a frame buffer.

However, this interlock can be avoided by mapping the image on the screen to subbanks #1A–#4A and #1B–#4B as shown in FIG. 11. In drawing a vector 900 shown in FIG. 11, the drawing speed is equal to that of the structure of 8 completely independent banks since the subbanks are accessed in the sequence of #1A, #2A, #4A, #3A and #1B. By mapping an image so that banks having the possibility of causing interlock are not arranged adjacent to each other, interlock will not occur between banks even when they are provided in a hierarchical manner.

The present invention is not limited to the above-described embodiments. The indicated number of subarrays, the bus widths, and the like are only a way of example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a dynamic memory cell array including a plurality of bit line pairs, a series of sense amplifiers connected to said plurality of bit line pairs, a plurality of read/write line pairs connected to the plurality of bit line pairs, a plurality of read buffers, each corresponding to one of said read/write line pairs, and connected to said corresponding read/write line pair, a plurality of write buffers, each corresponding to one of said read/write line pairs, and connected to said corresponding read/write line pair, a plurality of first read lines, each corresponding to one of said read buffers, and connected to said corresponding read buffer, a plurality of first write lines, each corresponding to one of said write buffers, and connected to said corresponding write buffer, a read register connected to said plurality of first read lines, a write register connected to said plurality of first write lines, a static memory cell array, a second write line connected between said read register and said static memory cell array for transferring data from said read register to said static memory cell array, and a second read line connected between said static memory cell array and said write register for transferring data from said static memory cell array to said write register.

2. The semiconductor memory device according to claim 1, wherein the operating frequency of said second write and read lines is N times the operating frequency of said first read and write lines, where N is a natural number, and the number of said second write and read lines is 1/N times the number of said first read and write lines.

3. The semiconductor memory device according to claim 1, wherein said read and write buffers are adjacent to said series of sense amplifiers, said read and write registers are adjacent to said static memory cell array, and said first read and write lines are formed on said dynamic memory cell array.

4. The semiconductor memory device according to claim 1, wherein said read and write buffers and said read and write registers are adjacent to said series of sense amplifiers, and said second write and read lines are formed on said dynamic memory cell array.

5. A semiconductor memory device comprising:

a dynamic memory cell array, wherein said dynamic memory cell array is divided into a plurality of main banks, and each said main bank is divided into a plurality of subbanks, a plurality of first decoders, each corresponding to one of said main banks, and connected to said corresponding main bank, and a plurality of second decoders, each corresponding to one of said subbanks and connected to its corresponding subbank, which is the only subbank to which the corresponding second decoder is connected.

* * * * *